(12) United States Patent
Kruwinus et al.

(10) Patent No.: US 6,169,038 B1
(45) Date of Patent: Jan. 2, 2001

(54) METHOD FOR ROUGH-ETCHING A SEMICONDUCTOR SURFACE

(75) Inventors: Hans-Jürgen Kruwinus; Frederic Kovacs, both of Österreich (DE)

(73) Assignee: Sez Semiconductor-Equipment Zubehor fur die Halbleiterfertigung AG, Villach (AT)

(*) Notice: Under 35 U.S.C. 154(b), the term of this patent shall be extended for 0 days.

(21) Appl. No.: 09/251,288

(22) Filed: Feb. 17, 1999

(30) Foreign Application Priority Data

Feb. 17, 1998 (DE) .............................................. 198 06 406

(51) Int. Cl.⁷ ...................................................... H01L 21/00
(52) U.S. Cl. ............................................ 438/745; 438/747
(58) Field of Search ..................................... 438/745, 747, 438/748, 749, 753; 216/91, 92; 156/345 L

(56) References Cited

U.S. PATENT DOCUMENTS

| | | | |
|---|---|---|---|
| 4,252,865 | * 2/1981 | Gilbert et al. | 438/753 X |
| 4,557,785 | * 12/1985 | Ohkuma | 216/91 X |

* cited by examiner

*Primary Examiner*—William Powell
(74) *Attorney, Agent, or Firm*—John F. A. Earley; John F. A. Earley, III; Harding, Earley, Follmer & Frailey

(57) ABSTRACT

The invention refers to a method for etching a semiconductor surface, wherein the surface is subject to a wet treatment in several process steps.

14 Claims, No Drawings

METHOD FOR ROUGH-ETCHING A SEMICONDUCTOR SURFACE

The invention refers to a method for rough-etching a semiconductor surface.

The manufacture of semiconductors, for example in the form of so-called wafers (circular semiconductor disks based on silicon) requires always special care. This includes also a defined roughness of their surface(s).

As follows from the EP 0 791 953 A2, the wafers may first be polished on both sides (surfaces). Then, the front and the back face are not discernible any longer. This also is true in employing optical sensors, at least as long as both surfaces have the same "surface structure".

Before the wafer surface is coated with different layers, for example of gold, titanium, copper or polysilicium, the respective surface has to be cleaned and roughened. The aim is a defined roughness being constant throughout the semiconductor surface.

In this context, the EP 0 791 953 A2 proposes to etch a wafer surface by means of a mixture of acids and to polish again the other surface.

The etching time is indicated to be 1 to 3 minutes for a wafer having a diameter of 150 mm. The semiconductor (wafer) is rotated with 10 to 100 rpm during the etching process. The amount of echtant is indicated to be 2–3 liters/min. The roughness of the treated surface was increased from Ra=0.01 $\mu$m to Ra=0.5 to 1.0 $\mu$m (DIN 4766 T1) after etching (corresponding to a roughness of 5,000 to 10.000 Angström).

In this method, disadvantage of an uneven etching treatment remains, especially in highly doped wafers. After etching, the surface is uneven and mostly not reproducible. Dilute etching liquids are not sufficient to obtain the desired roughness.

Absolutely to our surprise, it was found that wafers having a constant reproducible surface roughness can be produced using a rotary etching process, if the etching treatment is carried out on an already wet surface. Particularly constant results can be obtained, if the prewetting of the semiconductor surface is effected on the whole surface, which can be effected in a rotating wafer (for example within an associated chuck) in the fraction of a second, even in a point-like application.

The etching liquid is applied to the semiconductcor surfaces not until after the prewetting.

The etching process is substantially more controllable as compared with the known technologies as described above. Distributing the etching liquid on the wet surface is effected within an extremely short time (within less than 1 second at rotational speeds of the wafers of 200 to 1,000/min) and with an excellent uniformness throughout the whole surface. On the wetted surface, the etching liquid spreads out spontaneously and uniformly. The wetting process is dropped for the etching liquid, if it is applied to an already wet surface.

The uniform, spontaneous distribution of the etching liquid prohibits the formation of local areas having an increased or reduced etchant amount or retention time.

The time for rough-etching may be reduced to less than 30 seconds, partly down to values of 1 to 10 seconds and thus for powers of 10, as compared to the prior art (1 to 3 minutes).

After the etching process the etched semiconductor surface may be washed with a non-etching fluid and/or dried.

The semiconductor is to rotate during all process steps. Here, the handling on a rotating chuck according to EP 316 296 B1 is a good opportunity. In this, the semiconductor may be displaced vertically on the chuck between the process steps, as proposed in the EP 316 296 B1.

According to an embodiment the etching liquid may be applied directly after wetting the semiconductor surface. Both process steps can be carried out within a few seconds.

The wafer may rotate during wetting its surface and/or during applying the etching liquid, rotational speeds of 300 to 500 per minute seem to be sufficient.

According to an embodiment of the process the semiconductor may rotate during wetting of its surface and/or during applying of the etching liquid with mostly constant speed.

After cutting off the feeding of etchant the rotational speed may be increased, in order to throw off laterally a remaining etching liquid in this way.

The rough-etching treatment may be carried out until a desired surface roughness is obtained, for example between 300 and 1,000 Angström.

Acids and mixtures of acids are suitable as the etching liquid, for example hydrofluoric acid, nitric acid, phosphoric acid and/or sulfuric acid.

Afterwards (possibly additionally), the surface may be washed and/or dried.

Deionized water is suitable for washing. Also, the semiconductor surface may be wetted with deionized water before the etching treatment. But a light acid, for example a highly diluted acid, my also be used. On the contrary, a liquid serving for the actual etching is not suitable for wetting. Such etchants result in an increase of the roughness of at least 50 Angström.

Finally it may be provided to dry the semiconductor surface with nitrogen or isopropanol vapor.

A method according to the invention with its steps (including pre- and aftertreatments) is described in the following:

A wafer is placed upon a chuck and then rotated with 500 rpm.

Deionized water is applied to one wafer surface, which distributes spontaneously in uniform manner and wets (humidifies) the surface.

The feeding of water is stopped. The wafer is displaced vertically in upward direction and the etching liquid (of hydrofluoric acid, nitric acid, phosphonic acid and sulfuric acid) is applied for 2 seconds (volumetric rate of flow 2 l/min, diameter of the wafer: 15 cm) in a second process chamber at a rotational speed being still constant. The feeding of etchant is stopped immediately.

The rotational speed is increased to 2,500/min and the remaining etching liquid is thrown off at the periphery.

The wafer is brought to a third working position within the chuck and deionized water is supplied immediately afterwards to the etched wafer surface for a short time and then nitrogen is blown to the surface.

The total treatment time is less than 30 s.

The obtained roughness is 650 Angström and is extremely uniform throughout the whole wafer surface.

In accordance with the invention, a method for rough-etching a semiconductor surface has the following features:
1.1 the semiconductor surface is wetted with a liquid,
1.2 an etching liquid is then applied to the wetted semiconductor surface,
1.3 the etched semiconductor surface is then washed with a non-etching fluid and/or dried,
the semiconductor rotating during all process steps.

In one embodiment of the invention, the etching treatment of the semiconductor surface is limited to less than 30 seconds at a volumetric rate of flow of the etching liquid of 1 to 3 l/min. In another embodiment of the invention, the etching treatment of the semiconductor surface is limited to less than 10 seconds at a volumetric rate of flow of the etching liquid of 1 to 3 l/min.

What is claimed is:

1. A method for rough-etching a semiconductor surface, having the following features:
   1.1 the semiconductor surface is wetted with a liquid,
   1.2 an etching liquid is then applied to the wetted semiconductor surface,
   1.3 the etched semiconductor surface is then washed with a non-etching fluid or dried,
   the semiconductor rotating during all process steps.

2. The method according to claim 1, wherein the etching liquid is applied immediately after wetting the semiconductor surface.

3. The method according to claim 1, wherein the semiconductor rotates at 200 to 1,000 rpm during wetting its surface.

4. The method according to claim 1, wherein the semiconductor rotates at a largely constant speed during wetting its surface.

5. The method according to claim 1, wherein the etching liquids is thrown off the semiconductor surface by increasing the rotational speed of the semiconductor and before the following washing or drying.

6. The method according to claim 1, wherein the etching treatment is effected until a surface roughness between 300 and 1,000 Angström is obtained.

7. The method according to claim 1, wherein the etching treatment of the semiconductor surface is limited to less than 30 seconds; and wherein the etching liquid is applied to the wetted semiconductor surface at a volumetric rate of flow of 1 to 3 l/min.

8. The method according to claim 7, wherein the etching treatment of the semiconductor surface is limited to less than 10 seconds.

9. The method according to claim 1, wherein the semiconductor surface is treated with an etching liquid containing at least one of the following acids: hydrofluoric acid, nitric acid, phosphoric acid and sulfuric acid.

10. The method according to claim 1, wherein the semiconductor surface is wetted with deionized water before the etching treatment.

11. The method according to claim 1, wherein the semiconductor surface is washed with deionized water after the etching treatment.

12. The method according to claim 1, wherein the semiconductor surface is dried with nitrogen or isopropanol vapor after the etching treatment and possibly following washing.

13. A method for rough-etching a semiconductor surface, having the following features:
   the semiconductor surface is wetted with a liquid;
   an etching liquid is then applied to the wetted semiconductor surface at a volumetric rate of flow of 1 to 3 l/min.;
   the etching semiconductor surface is then washed with a non-etching fluid or dried with nitrogen or isopropanol vapor;
   the semiconductor rotating during all process steps;
   wherein the etching liquid is applied immediately after wetting the semiconductor surface with a liquid;
   wherein the semiconductor rotates at 200 to 1,000 rpm during the wetting of its surface;
   wherein the etching treatment of the semiconductor surface is limited to less than 30 seconds;
   wherein the semiconductor surface is wetted with deionized water before the etching treatment;
   wherein etching liquid comprises at least one of the following acids: hydrofluoric acid, nitric acid, phosphoric acid and sulfuric acid; and
   wherein the non-etching fluid is deionized water.

14. A method for rough-etching a semiconductor surface, comprising the steps of:
   wetting the semiconductor surface with a liquid;
   applying an etching liquid to the wetted semiconductor surface;
   washing the etched semiconductor surface with a non-etching fluid or drying the etched semiconductor surface; and
   rotating the semiconductor during all process steps.

* * * * *